(12) United States Patent
Wu

(10) Patent No.: US 10,747,471 B2
(45) Date of Patent: Aug. 18, 2020

(54) CELL PROGRAMMING METHOD, MEMORY CONTROL CIRCUIT UNIT AND MEMORY STORAGE DEVICE

(71) Applicant: PHISON ELECTRONICS CORP., Miaoli (TW)

(72) Inventor: Chao-Han Wu, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/005,705

(22) Filed: Jun. 12, 2018

(65) Prior Publication Data

US 2019/0332320 A1     Oct. 31, 2019

(30) Foreign Application Priority Data

Apr. 26, 2018   (TW) .............................. 107114149 A

(51) Int. Cl.
| | |
|---|---|
| *G06F 12/00* | (2006.01) |
| *G06F 3/06* | (2006.01) |
| *G11C 16/10* | (2006.01) |
| *G11C 16/34* | (2006.01) |
| *G06F 13/00* | (2006.01) |
| *G06F 13/28* | (2006.01) |
| *G11C 11/56* | (2006.01) |
| *G11C 16/04* | (2006.01) |

(52) U.S. Cl.
CPC .......... *G06F 3/0659* (2013.01); *G06F 3/0604* (2013.01); *G06F 3/0652* (2013.01); *G06F 3/0679* (2013.01); *G11C 16/10* (2013.01); *G11C 16/349* (2013.01); *G11C 11/5628* (2013.01); *G11C 11/5671* (2013.01); *G11C 16/0483* (2013.01)

(58) Field of Classification Search
CPC .... G06F 3/0659; G06F 3/0604; G06F 3/0652; G06F 3/0679; G11C 16/10; G11C 16/349; G11C 11/5671; G11C 16/0483; G11C 11/5628

See application file for complete search history.

(56) References Cited

U.S. PATENT DOCUMENTS

| | | | | |
|---|---|---|---|---|
| 2008/0301532 | A1* | 12/2008 | Uchikawa | G06F 11/1072 714/773 |
| 2010/0265768 | A1* | 10/2010 | Kasuga | G06F 11/1072 365/185.03 |
| 2012/0005415 | A1* | 1/2012 | Jung | G06F 12/0246 711/103 |
| 2018/0211708 | A1* | 7/2018 | Igahara | G11C 11/5628 |
| 2019/0018598 | A1* | 1/2019 | Hung | G06F 3/0613 |

* cited by examiner

*Primary Examiner* — Mark A Giardino, Jr.
(74) *Attorney, Agent, or Firm* — JCIPRNET

(57) ABSTRACT

A data writing method, a memory control circuit unit, and a memory storage device are provided. The method includes: determining whether to use a first programming mode or a second programming mode to program memory cells according to a first data amount and a second data amount; when the first data amount is greater than the second data amount, programming the memory cells by using the first programming mode; and when the first data amount is not greater than the second data amount, programming the memory cells by using the second programming mode.

21 Claims, 7 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

CELL PROGRAMMING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 107114149, filed on Apr. 26, 2018. The entirety of the above-mentioned patent application is hereby incorporated by reference herein and made a part of this specification.

BACKGROUND

Technical Field

The invention relates to a data writing method, a memory control circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Based on the number of bits that each memory cell can store, NAND flash memory modules may be classified into a single level cell (SLC) NAND flash memory module, a multi level cell (MLC) NAND flash memory module and a trinary level cell (TLC) NAND flash memory module. Among them, each memory cell of the SLC NAND flash memory module can store data of one bit (i.e., "1" and "0"), each memory cell of the MLC NAND flash memory module can store data of two bits, and each memory cell of the TLC NAND flash memory module can store data of three bits. Further, the memory cells in the MLC NAND flash memory module and the TLC NAND flash memory module may also be used for simulating the SLC NAND flash memory module, and the memory cells in the MLC NAND flash memory module and the TLC NAND flash memory module used for simulating the SLC NAND flash memory module only stores data of one bit.

In general, if one memory cell can store multiple bits (e.g., the MLC or TLC flash memory module), physical programming units belonging to the same word line may at least be classified into a lower physical programming unit and an upper physical programming unit. For instance, in the MLC NAND flash memory module, a least significant bit (LSB) of one memory cell belongs to the lower physical programming unit, and a most significant bit (MSB) of that memory cell belongs to the upper physical programming unit. In an exemplary embodiment, the lower physical programming unit is also known as a fast page, and the upper physical programming unit is also known as a slow page. In particular, in the MLC NAND flash memory module, one lower physical programming unit and one upper physical programming unit corresponding to that lower physical programming unit may be collectively referred to as a "physical programming unit group". Further, in the TLC NAND flash memory module, the least significant bit (LSB) of one memory cell belongs to the lower physical programming unit, a center significant bit (CSB) of that memory cell belongs to a center physical programming unit, and the most significant bit (MSB) of that memory cell belongs to the upper physical programming unit. In particular, in the TLC NAND flash memory module, one lower physical programming unit and one center physical programming unit and one upper physical programming unit corresponding to that lower physical programming unit may be collectively referred to as the "physical programming unit group". The MLC or TLC NAND flash memory module usually includes a plurality of physical erasing units and each of the physical erasing units may include a plurality of physical programming units, where one physical erasing unit is usually a unit used for erasing in the flash memory module.

In general, certain physical erasing units in the MLC or TLC NAND flash memory module may be selected for simulating the SLC NAND flash memory module. In the process of writing data into the MLC or TLC NAND flash memory module, one specific physical programming unit group may be selected from one physical erasing unit selected for simulating the SLC NAND flash memory module, and a first programming mode (a.k.a. a single-page programming mode) may be used to write data into the selected physical programming unit group such that each memory cell among the memory cells in the selected physical programming unit group only stores data of one bit. For example, data is stored simply by using the least significant bit (LSB) in the memory cells of the selected physical programming unit group. In other words, if the MLC or TLC NAND flash memory module is used for simulating the SLC NAND flash memory module, only the "lower physical programming unit" can be used for writing (or storing) data when the first programming mode is used for writing. In addition, the center physical programming unit and the upper physical programming unit corresponding to the lower physical programming unit used for writing data would not be used for storing data.

It should be noted that, since the speed for writing the lower physical programming unit is relatively faster, a higher writing performance may be achieved when the MLC or TLC NAND flash memory module is used for simulating the SLC NAND flash memory module. However, based on physical characteristics of the flash memory, when the MLC NAND flash memory module (or the TLC NAND flash memory module) is used for simulating the SLC NAND flash memory module, wearing of the flash memory module can lead to reduction on life cycle of the flash memory module. For example, an erase count (or frequency) of the physical erasing units used for simulating the SLC NAND flash memory module may be relatively higher and thereby causing wearing of the flash memory module.

In order to solve aforesaid problem, a threshold is normally set in the conventional technology. In this way, when the erase count of the physical erasing units in the MLC or TLC NAND flash memory module reaches the threshold, the physical erasing units used for simulating the SLC NAND flash memory module may be restored to be used by the MLC or TLC NAND flash memory module. In other words, the physical erasing units used for simulating the SLC NAND flash memory module are restored such that data is written by using a second programming mode (a.k.a. a multi-page programming mode). Here, each memory cell among the memory cells of the physical programming unit group written by using the second programming mode stores data of multiple bits. In other words, when being written by using the second programming mode, the "lower physical programming unit", the "center physical programming unit"

and the "upper physical programming unit" of the physical programming unit group may all be used for writing (or storing) data.

Nonetheless, in said method that uses the threshold, normally, the MLC or TLC NAND flash memory module cannot be used for simulating the SLC NAND flash memory module again so writing performance cannot be improved by using the first programming mode again, resulting in poor efficiency.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a data wiring method, a memory control circuit unit and a memory storage device that can dynamically determine whether to use the first programming mode or the second programming mode to program the memory cells. As a result, after the erase count of the rewritable non-volatile memory module is higher than the threshold, the conventional problem in which only the second programming mode can be used while the first programming mode can no longer be used may then be solved.

The invention proposes a data writing method, which is adapted to a memory storage device. The memory storage device has a rewritable non-volatile memory module. The rewritable non-volatile memory module includes a plurality of physical erasing units. Each physical erasing unit among the physical erasing units has a plurality of memory cells. The data writing method includes: determining whether to use a first programming mode or a second programming mode to program the memory cells according to a first data amount and a second data amount, where the first data amount is a data amount currently available to a host system for writing in the rewritable non-volatile memory module, and the second data amount is a remaining data amount needed to be provided to the host system for writing in the rewritable non-volatile memory module; when the first data amount is greater than the second data amount, programming the memory cells by using the first programming mode; and when the first data amount is not greater than the second data amount, programming the memory cells by using the second programming mode, wherein the number of stored bits in the memory cells programmed by using the first programming mode is less than the number of stored bits in the memory cells programmed by using the second programming mode.

The invention proposes a memory control circuit unit, which includes a host interface, a memory interface and a memory management circuit. The host interface is configured to couple to a host system. The memory interface is configured to couple to the rewritable non-volatile memory module. The rewritable non-volatile memory module includes a plurality of physical erasing units, and each physical erasing unit among the physical erasing units has a plurality of memory cells. The memory management circuit is coupled to the host interface and the memory interface, and configured to perform following operations: determining whether to use a first programming mode or a second programming mode to program the memory cells according to a first data amount and a second data amount, wherein the first data amount is a data amount currently available to the host system for writing in the rewritable non-volatile memory module, and the second data amount is a remaining data amount needed to be provided to the host system for writing in the rewritable non-volatile memory module; when the first data amount is greater than the second data amount, programming the memory cells by using the first programming mode; and when the first data amount is not greater than the second data amount, programming the memory cells by using the second programming mode, wherein the number of stored bits in the memory cells programmed by using the first programming mode is less than the number of stored bits in the memory cells programmed by using the second programming mode.

The invention proposes a memory storage device, which includes a connection interface unit, a rewritable non-volatile memory module and a memory control circuit unit. The connection interface unit is configured to couple to a host system. The rewritable non-volatile memory module has a plurality of physical erasing units, and each physical erasing unit among the physical erasing units has a plurality of memory cells. The memory control circuit unit is configured to couple to the connection interface unit and the rewritable non-volatile memory module, and configured to perform following operations: determining whether to use a first programming mode or a second programming mode to program the memory cells according to a first data amount and a second data amount, wherein the first data amount is a data amount currently available to the host system for writing in the rewritable non-volatile memory module, and the second data amount is a remaining data amount needed to be provided to the host system for writing in the rewritable non-volatile memory module; when the first data amount is greater than the second data amount, programming the memory cells by using the first programming mode; and when the first data amount is not greater than the second data amount, programming the memory cells by using the second programming mode, wherein the number of stored bits in the memory cells programmed by using the first programming mode is less than the number of stored bits in the memory cells programmed by using the second programming mode.

Based on the above, according to the data writing method, the memory control circuit unit and the memory storage device of the invention, the first data amount and the second data amount may be calculated and obtained so whether to use the first programming mode or the second programming mode to program the memory cells may be dynamically decided according to the calculated first data amount and the calculated second data amount. As a result, after the erase count of the rewritable non-volatile memory module is higher than the threshold, the conventional problem in which only the second programming mode can be used while the first programming mode can no longer be used may then be solved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
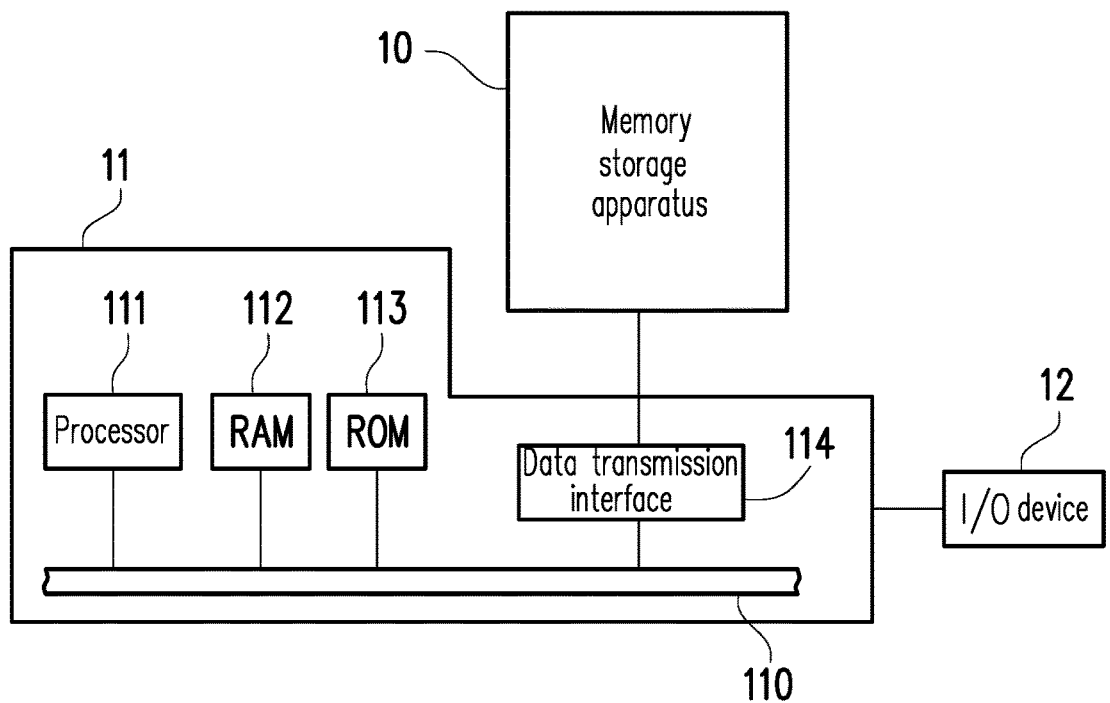
FIG. 1 is a schematic diagram illustrating a host system, a memory storage device and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit unit). The memory storage device is usually configured together with a host system so the host system can write data into the memory storage device or read data from the memory storage device.

Figure 2:
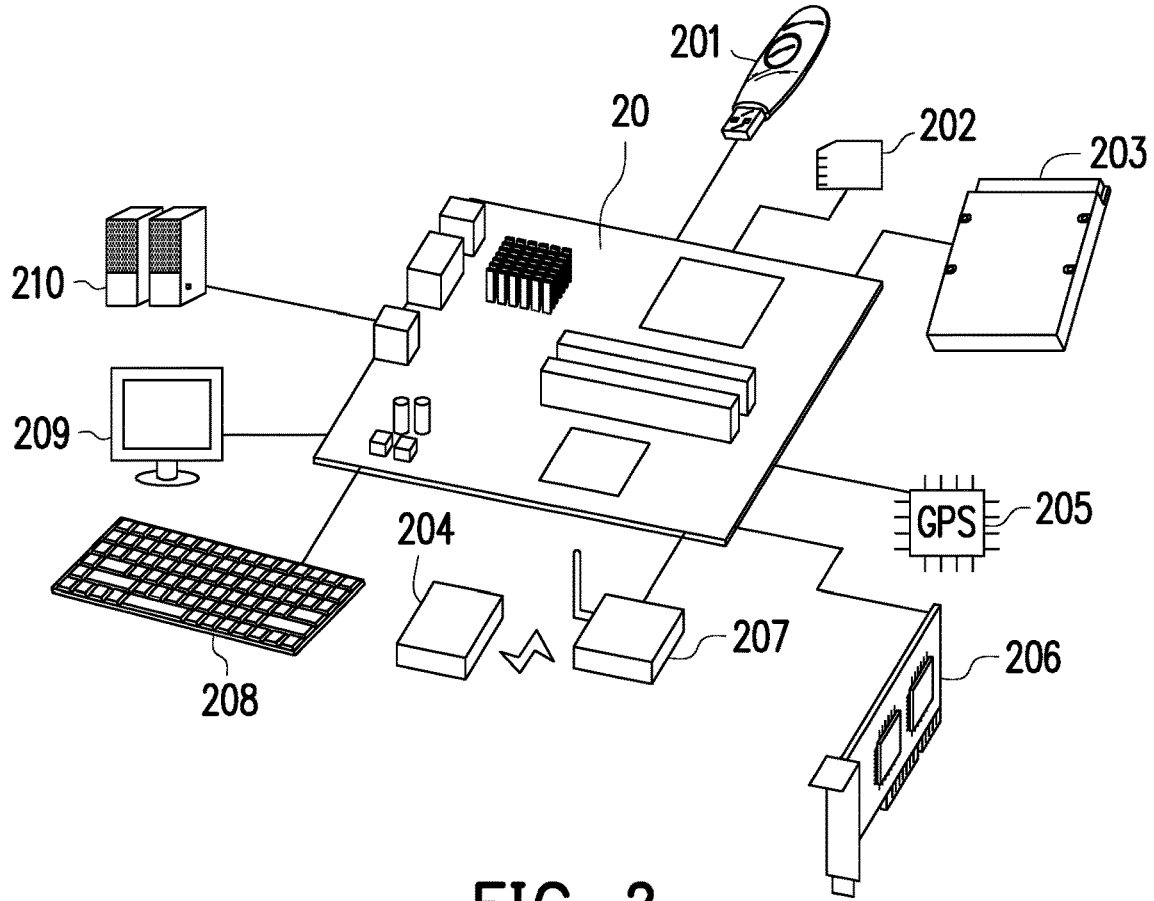
FIG. 2 is a schematic diagram illustrating a host system, a memory storage device and an input/output (I/O) device according to another exemplary embodiment.

FIG. 1 is a schematic diagram illustrating a host system, a memory storage device and an input/output (I/O) device according to an exemplary embodiment, and FIG. 2 is a schematic diagram illustrating a host system, a memory storage device and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can write data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication Storage) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
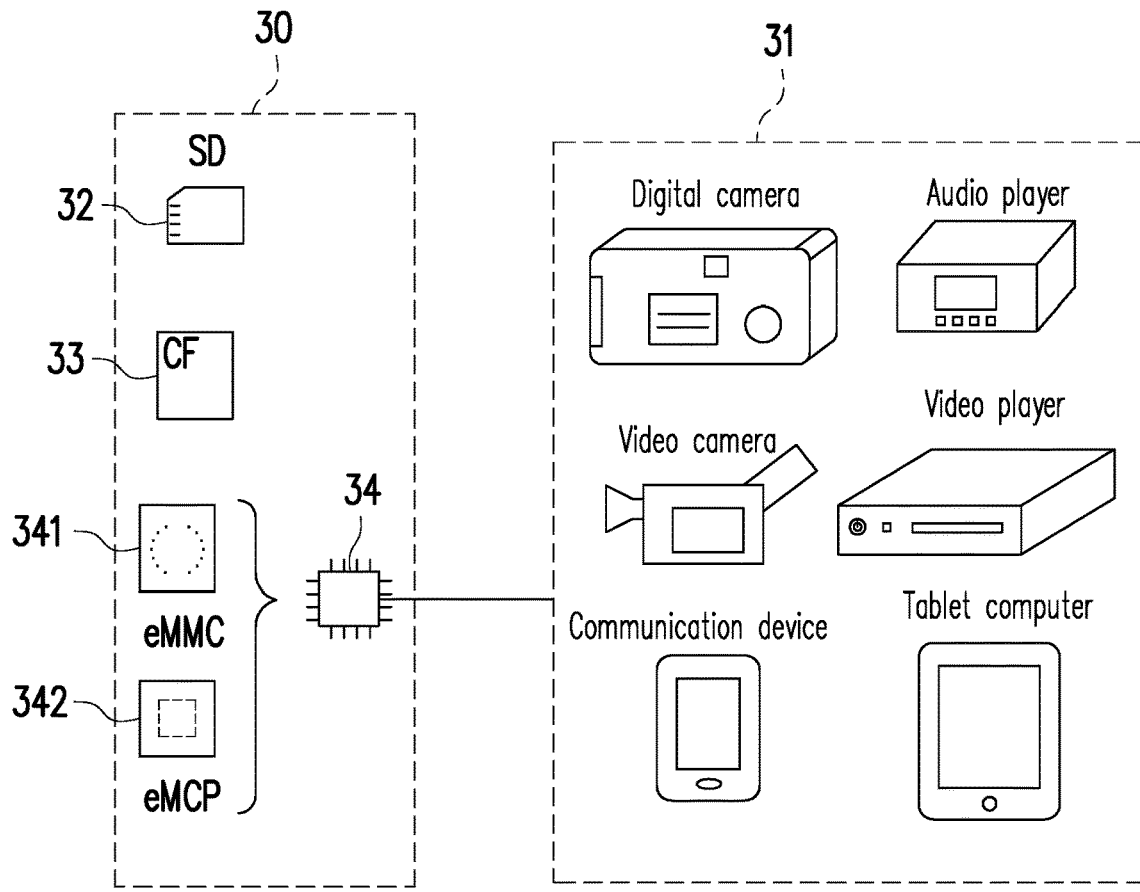
FIG. 3 is a schematic diagram illustrating a host system and a memory storage device according to another exemplary embodiment.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment. Referring to FIG. 3, in another exemplary embodiment, a host system 31 may also be a system including a digital camera, a video camera, a communication device, an audio player, a video player or a tablet computer, and a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
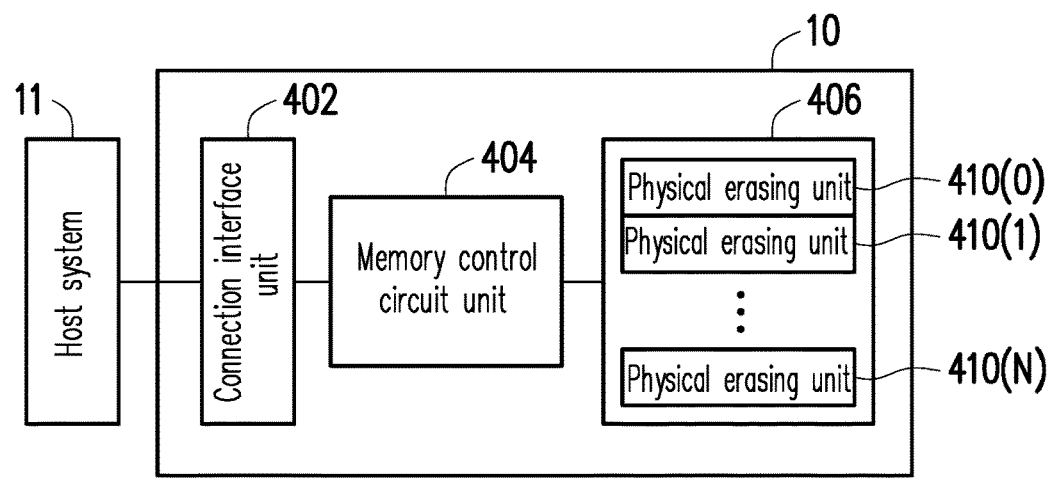
FIG. 4 is a schematic block diagram illustrating a host system and a memory storage device according to an exemplary embodiment.

FIG. 4 is a schematic block diagram illustrating a host system and a memory storage device according to one exemplary embodiment.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited to the above. Each physical erasing unit may be constituted by 64 physical programming units, 256 physical programming units or any number of the physical programming units.

More specifically, the physical erasing unit is a minimum unit for erasing. Namely, each physical erasing unit contains the least number of memory cells to be erased together. The physical programming unit is the minimum unit for programming. That is, the physical programming unit is the minimum unit for writing data. Each physical programming unit usually includes a data bit area and a redundant bit area. The data bit area containing multiple physical access addresses is used for storing user data, and the redundant bit area is used to store system data (e.g., control information and error checking and correcting code). In the present exemplary embodiment, each data bit area of the physical programming unit contains 8 physical access addresses, and the size of each physical access address is 512 byte. However, in other exemplary embodiments, the data bit area may also include more or less of the physical access addresses, and an amount and a size of the physical access addresses are not limited in the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 406 is a TLC (Trinary Level Cell) NAND flash memory module (i.e., a flash memory module capable of storing three data bits in one memory cell). However, the invention is not limited to the above. The rewritable non-volatile memory module 406 may also be a Multi Level Cell (MLC) NAND flash memory module (i.e., a flash memory module capable of storing two data bits in one memory cell) or other memory module having the same features.

Figures 5A, 5B:
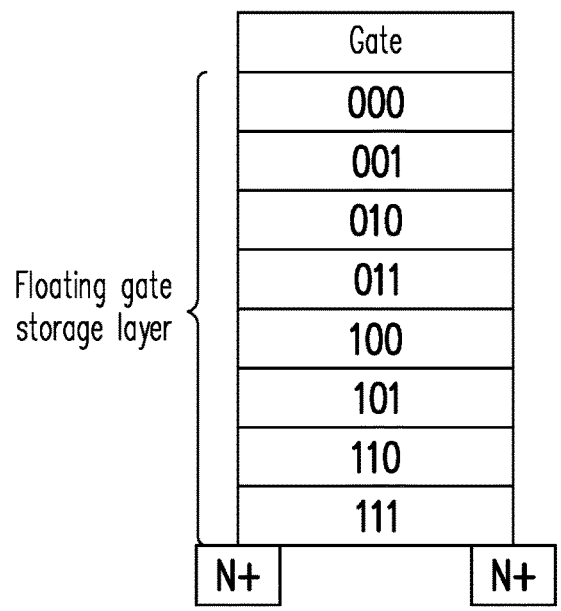
FIG. 5A and FIG. 5B are schematic diagrams illustrating a memory cell storage structure and a physical erasing unit according to the present exemplary embodiment.

FIG. 5A and FIG. 5B are schematic diagrams illustrating a memory cell storage structure and a physical erasing unit according to the present exemplary embodiment.

Referring to FIG. 5A, each storage state of each memory cell in the rewritable non-volatile memory module 406 can be identified as "111", "110", "101", "100", "011", "010", "001" or "000" (as shown in FIG. 5A). The first bit counted from the left side of the storage state is the LSB, the second bit counted from the left side of the storage state is the CSB and the third bit counted from the left side of the storage state is the MSB. In addition, the memory cells arranged on the same word line can constitute three physical programming units. Here, the physical programming unit constituted by the LSBs of said memory cells is known as the lower physical programming unit, the physical programming unit constituted by the CSBs of said memory cells is known as a center physical programming unit, and the physical programming unit constituted by the MSBs of said memory cells is known as the upper physical programming unit.

Referring to FIG. 5B, one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method. In other words, in the exemplary embodiment of FIG. 5, the physical erasing unit includes 258 physical programming units in total, and the lower physical programming unit, the center physical programming unit and the upper physical programming unit constituted by multiple memory cells arranged on the same word line can constitute one physical programming unit group. Therefore, the physical erasing unit of FIG. 5 may be divided into 86 physical programming unit groups in total. However, it should be noted that, the invention is not intended to limit the numbers of the physical programming unit or the physical programming unit groups in the physical erasing unit.

Figure 6:
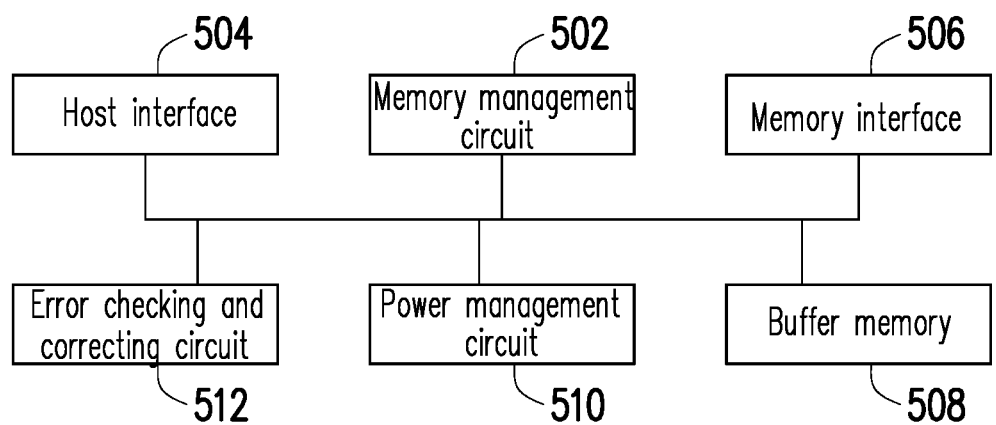
FIG. 6 is a schematic block diagram illustrating a memory control circuit unit according to an exemplary embodiment.

FIG. 6 is a schematic block diagram illustrating a memory control circuit unit according to an exemplary embodiment.

Referring to FIG. 6, the memory control circuit unit 404 includes a memory management circuit 502, a host interface 504, a memory interface 506, a buffer memory 508, a power management circuit 510, and an error checking and correcting circuit 512.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, description regarding operations of the memory management circuit 502 or any circuit element in the memory controlling circuit unit 404 is equivalent to description regarding operations of the memory controlling circuit unit 404.

In this exemplary embodiment, the control commands of the memory management circuit 502 are implemented in form of firmware. For instance, the memory management circuit 502 has a microprocessor unit (not illustrated) and a read-only memory (not illustrated), and the control commands are burnt into the read-only memory. During operation of the memory storage device 10, the control commands are executed by the microprocessor to perform operations of writing, reading or erasing data.

Figure 7:
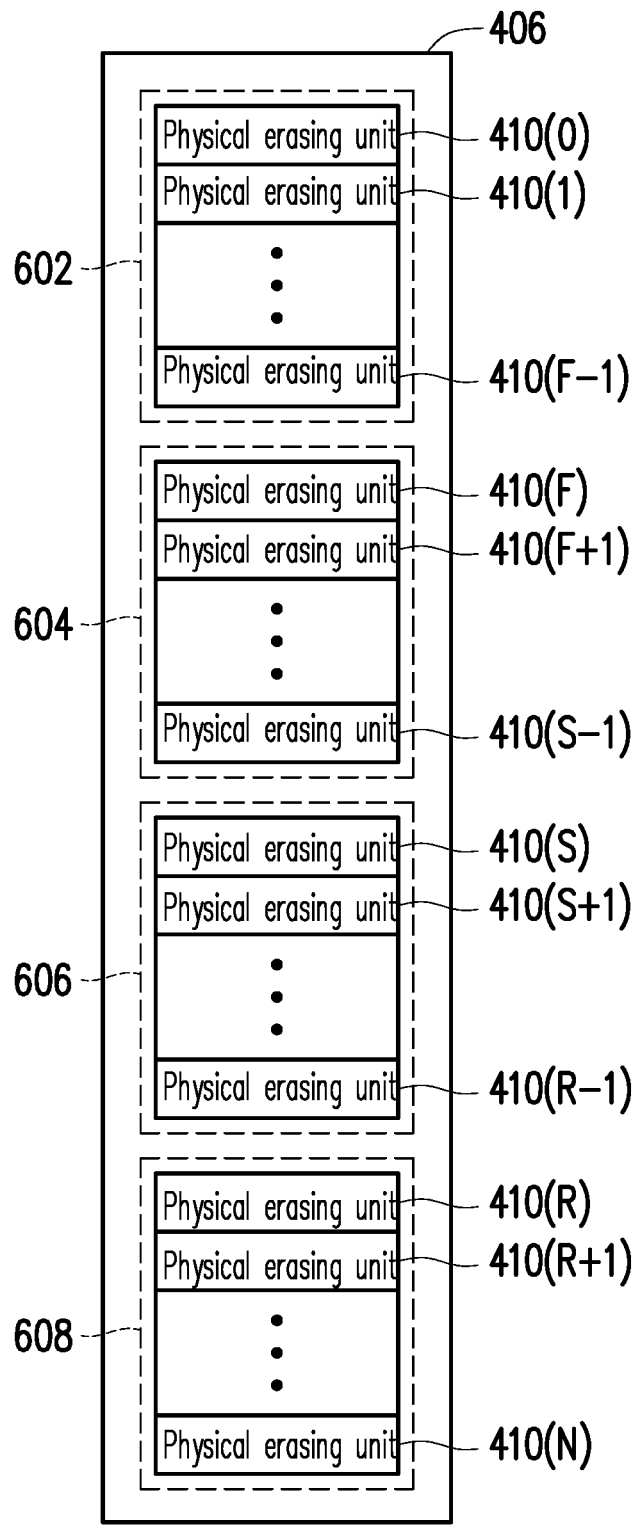
FIG. 7 and FIG. 8 are schematic diagrams illustrating a management of the physical erasing units according to an exemplary embodiment.
Figure 8:
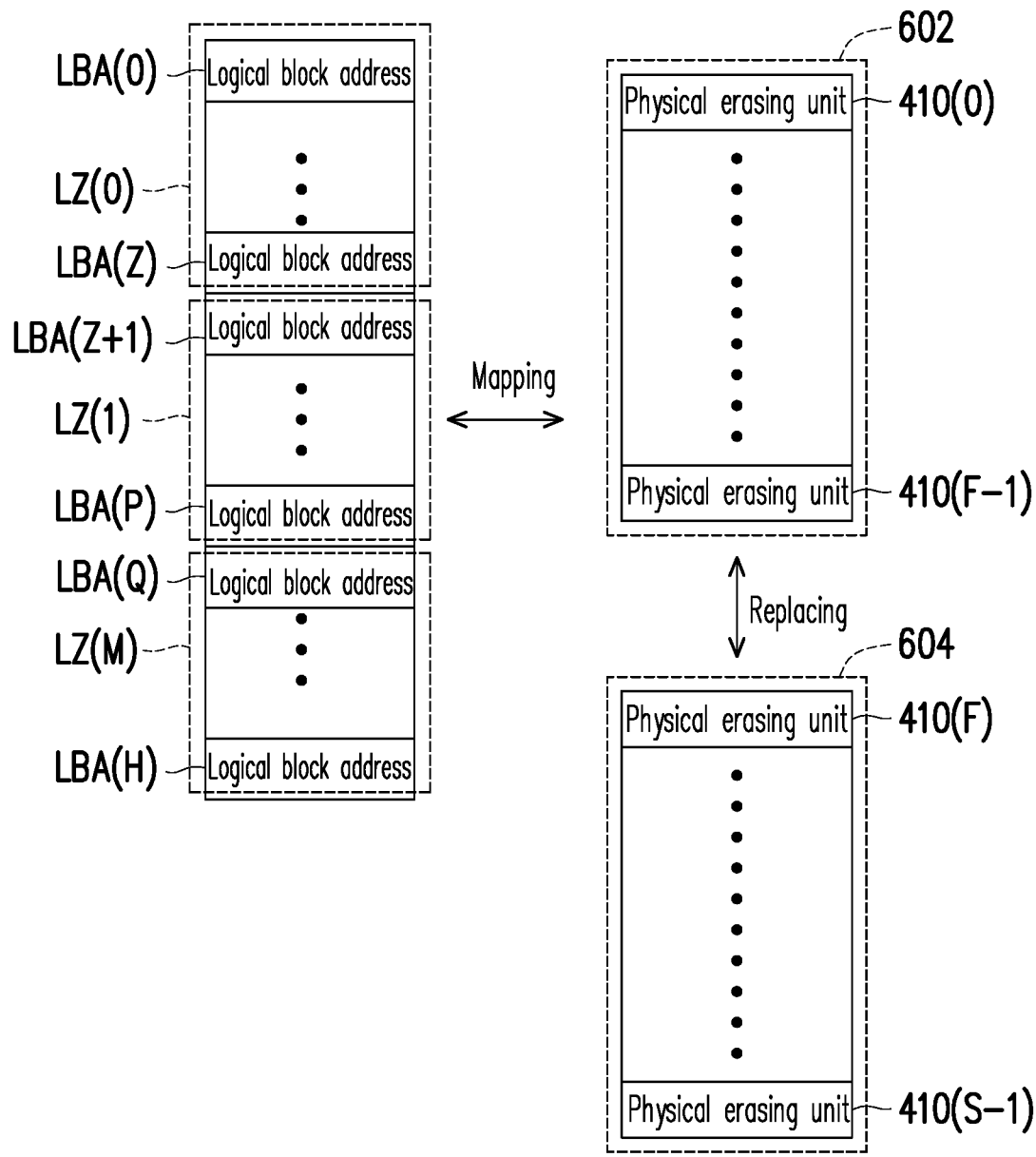

FIG. 7 and FIG. 8 are schematic diagrams illustrating a management of the physical erasing units according to an exemplary embodiment.

It should be understood that terms, such as "retrieve", "group", "divide", "associate" and so forth, are logical concepts which describe operations in the physical erasing units of the rewritable non-volatile memory module 406. In other words, the physical erasing units of the rewritable non-volatile memory module are logically operated so actual positions of the physical units of the rewritable non-volatile memory module are not changed.

Referring to FIG. 7, the memory control circuit unit 404 (or the memory management circuit 502) may logically group the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with the data, whereas the physical erasing units of the spare area 604 are configured to replace the physical erasing units of the data area 602. In other words, when the write command and the data to be written are received from the host system 11, the memory control circuit unit 404 (or the memory management unit 502) uses the physical erasing units retrieved from the spare area 604 as replacement to the physical erasing units in the data area 602 for writing data.

The physical erasing units logically belonging to the system area 606 are configured to record system data. For example, the system data includes information related to manufacturer and model of the rewritable non-volatile memory module, the number of physical erasing units in the rewritable non-volatile memory module, the number of the physical programming units in each physical erasing unit, and so forth.

The physical erasing units logically belonging to the replacement area 608 are used in a bad physical erasing unit replacement procedure for replacing damaged physical erasing units. More specifically, if there are still usable physical erasing units available in the replacement area 608 when the physical erasing units of the data area 602 are damaged, the memory control circuit unit 404 (or the memory management unit 502) can retrieve the usable physical erasing units from the replacement area 608 for replacing the damaged physical erasing units.

In particular, the numbers of the physical erasing units in the data area 602, the spare area 604, the system area 606 and the replacement area 608 may be different from one another according to the different memory specifications. In addition, it should be understood that, during operation of the memory storage device 10, grouping relations of the physical erasing units for associating with the data area 602, the spare area 604, the system area 606, and the replacement area 608 may be dynamically changed. For example, when the damaged physical erasing units in the spare area 604 are replaced by the physical erasing units in the replacement area 608, the physical erasing units originally from the replacement area 608 are then associated with the spare area 604.

Referring to FIG. 8, the memory control circuit unit 404 (or the memory management circuit 502) assigns logical block addresses LBA(0) to LBA(H) for mapping to the physical erasing units of the data area 602. Each of the logical block addresses includes a plurality of logical addresses for mapping to the corresponding physical programming units of the physical erasing units. Further, when the host system 11 intends to write the data into the logical addresses or update the data stored in the logical addresses, the memory control circuit unit 404 (or the memory management unit 502) can retrieve one physical erasing unit from the spare area 604 as an active physical erasing unit to replace the physical erasing units of the data area 602 for writing data. Further, when the active physical erasing unit serving as the active physical erasing unit is fully written, the memory management circuit 502 can again retrieve an empty physical erasing unit from the spare area 604 as the active physical erasing unit to continue writing the data corresponding to the write command from the host system 1000. Further, when the number of available physical erasing units in the spare area 604 is less than a preset value, the memory management circuit 502 can perform a garbage collection operation (a.k.a. a valid data merging operation) to arrange the valid data in the data area 602, so as to re-associate the physical erasing units not stored with the valid data in the data area 602 to the spare area 604.

In order to identify which of the physical programming units is data in each of the logical addresses being stored to, the memory control circuit unit 404 (or the memory management circuit 502) can record the mapping relations between the logical addresses and the physical programming units. For example, in the present exemplary embodiment, the memory control circuit unit 404 (or the memory management circuit 502) stores a logical-physical mapping table in the rewritable non-volatile memory module 406 for recording the physical programming unit mapped by each of the logical addresses. When intending to access data, the memory control circuit unit 404 (or the memory management circuit 502) loads the logical-physical mapping table into the buffer memory 508 for maintenance and writes or reads data according to the logical-physical mapping table.

It is worth mentioning that, the buffer memory 508 is unable to store the mapping table recording the mapping relations of all the logical addresses due to limited capacity. Therefore, in the present exemplary embodiment, the memory control circuit unit 404 (or the memory management unit 502) groups the logical block addresses LBA(0) to LBA(H) into a plurality of logical zones LZ(0) to LZ(M), and configures one logical-physical mapping table for each of the logical zones. In particular, when the memory control circuit unit 404 (or the memory management unit 502) intends to update a mapping of one specific logical block address, the logical-physical table corresponding to the logical zone to which the specific logical block address belongs is loaded into the buffer memory 508 for updating. Specifically, if the logical-physical mapping table corresponding to the logical zone to which the specific logical block address belongs is not temporarily stored in the buffer memory 508 (i.e., the mapping of the logical block address to be updated is not recorded in the logical-physical mapping table temporarily stored in the buffer memory 508), the memory control circuit unit 404 (or the memory management circuit 502) can perform a mapping table swapping operation to restore the current logical-physical mapping table temporarily stored in the buffer memory 508 back to the rewritable non-volatile memory module 406, and loads the logical-physical mapping table recorded with the mapping of the logical block address to be updated into the buffer memory 508.

In another exemplary embodiment of the invention, the control commands of the memory management circuit 502 may also be stored, in form of program codes, into a specific area (e.g., a system area in the memory module exclusively used for storing the system data) of the rewritable non-volatile memory module 406. In addition, the memory management circuit 502 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 406 to the RAM of the memory management circuit 502 when the memory control circuit unit 404 is enabled. Thereafter, the control commands are executed by the microprocessor unit to perform operations of writing, reading or erasing data.

Further, in another exemplary embodiment of the invention, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to give a write command to the rewritable non-volatile memory module 406 in order to write data into the rewritable non-volatile memory module 406; the memory reading circuit is configured to give a read command to the rewritable non-volatile memory module 406 in order to read data from the rewritable non-volatile memory module 406; the memory erasing circuit is configured to give an erase command to the rewritable non-volatile memory module 406 in order to erase data from the rewritable non-volatile memory module 406; and The data processing circuit is configured to process both the data to be written into the rewritable non-volatile memory module 406 and the data read from the rewritable non-volatile memory module 406.

Referring back to FIG. 6, the host interface 504 is coupled to the memory management circuit 502 and configured to couple to the connection interface unit 402, so as to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the invention is not limited to the above. The host interface 504 may also be compatible with the PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control power of the memory storage device 10.

The error checking and correcting circuit 512 is coupled to the memory management circuit 502 and configured to execute an error checking and correcting procedure to ensure the data integrity. For example, when a write command is received by the memory management circuit 502 from the host system 11, the error checking and correcting circuit 512 can generate an ECC code (error checking and correcting code) for data corresponding to the write command so the memory management circuit 502 can write the data and the ECC code corresponding to the write command to the rewritable non-volatile memory module 406. Subsequently, the memory management circuit 502 can read the error checking and correcting code corresponding to the data while reading the data from the rewritable non-volatile memory module 406, and the error checking and correcting circuit 512 can then perform the error checking and correcting procedure for the read data according to the error checking and correcting code.

It is worth mentioning that, in the present exemplary embodiment, the memory management circuit 502 programs the data into the rewritable non-volatile memory module 406 by using different programming modes in different states. For example, the memory management circuit 502 can program the data into the physical erasing unit by using a single-page programming mode (a.k.a. a first programming mode) or a multi-page programming mode (a.k.a. a second programming mode). Herein, a programming speed of programming the memory cells based on the single-page programming mode is higher than a programming speed of programming the memory cells based on the multi-page programming mode (i.e., an operating time required when programming data by using the multi-page programming mode is greater than an operating time required when programming data by using the single-page programming mode). Moreover, a reliability of the data stored based on the single-page programming mode is often higher than a reliability of the data stored based on the multi-page programming mode. The single-page programming mode is, for example, one of a SLC (Single Level Cell) programming mode, a lower physical programming mode, a mixture programming mode and a less level cell programming mode. More specifically, in the single level cell programming mode, one memory cell is only stored with data of one bit. In the lower physical programming mode, only the lower physical programming units are programmed, and the upper physical programming units corresponding to the lower physical programming units do not have be programmed. In the mixture programming mode, valid data (or real data) are programmed into the lower physical programming units, and dummy data is programmed into the upper physical programming units corresponding to the lower physical programming units sorted with the valid data at the same time. In the less layer memory cell mode, one memory cell stores data with a first number of bits. For example, the first number may be set as "1". The multi-page programming mode is, for example, a MLC (Multiple Level cell) programming mode, a TLC (Trinary Level Cell) programming mode or other similar modes. In the multi-page programming mode, one memory cell is stored with data of a second number of bits, and the second number is equal to or greater than "2". For example, the second number may be set as 2 or 3. In another exemplary embodiment, both the first number in the single-page programming mode and the second number in the multi-page programming mode may be other numbers as long as the second number is greater than the first number. In other words, the number (i.e., the first number) of data bits stored in each of the memory cells constituting a first-type physical erasing unit programmed by using the single-page programming mode is less than the number (i.e., the second number) of data bits stored in each of the memory cells constituting a second-type physical erasing unit programmed by using the multi-page programming mode.

Based on the above, the number of data bits stored by the memory cells programmed by using the multi-page programming mode is greater than the number of data bits stored in the memory cells programmed by using the single-page programming mode. Therefore, a data capacity of the physical erasing unit programmed by using the multi-page programming mode is greater than a data capacity of the physical erasing unit programmed by using the single-page programming mode.

It is noted that in the following description, some terms may be replaced with corresponding abbreviations for ease of reading (see Table 1).

TABLE 1

| rewritable non-volatile memory module | RNVM module |
| physical erasing unit | PEU |
| memory management circuit | MMC |

In the exemplary embodiments of the invention, when the RNVM module 406 just leaves factory, in order to increase the efficiency in use, the MMC 502 may use the single-page programming mode to program the memory cells in the RNVM module 406. In particular, in the exemplary embodiments of the invention, the MMC 502 periodically calculates a "first data amount" and a "second data amount", and dynamically determines whether the MMC 502 have to switch from using the single-page programming mode to using the multi-page programming mode to program the memory cells in the RNVM module 406 according to the calculated first data amount and the calculated second data amount. Herein, the "first data amount" represents a data amount currently available to the host system 11 for writing in the RNVM module 406. The "second data amount" represents a remaining data amount needed to be provided to the host system 11 for writing in the RNVM module 406.

More specifically, a calculation method of the first data amount may conduct calculation using the following equation:

$$FirstDataAmount = \frac{MaxEraseCount - CurrentEraseCount}{WAF \text{ Value}} \times DeviceSize$$

Here, "FirstDataAmount" is the first data amount.

"MaxEraseCount" is a maximum average erase count of the PEUs in the RNVM module 406. More specifically, the maximum average erase count represents the number of times that one single PEU may be erased in the RNVM modules 406. When the erase count of one PEU exceeds the maximum average erase count, it means that the memory cells in that PEU have reach certain wearing level and is no longer suitable to be used for programming. In addition, the maximum average erase count is usually provided by the provider of the RNVM module 406.

"CurrentEraseCount" is a current average erase count of the memory cells in the RNVM module 406. More specifically, the MMC 502 may record the erase count for each PEU in the RNVM module 406, and obtain an average value from a sum of the erase counts for each of the PEUs, so as to obtain the current average erase count of the memory cells in the RNVM module 406.

"DeviceSize" is an actual device size of the RNVM module 406. In other words, the device size may be a total device size of the RNVM module 406 when leaving factory.

"WAF Value" is a write amplification factor (WAF) value. This value is obtained by the developer of the RNVM module 406 via performing a test operation regulated by JEDEC (Joint Electron Device Engineering Council) on the RNVM module 406 before the RNVM module 406 leaves factory.

In other words, after a difference (a.k.a. a first value) between the maximum average erase count and the current average erase count is calculated and obtained, the first data amount is a quotient obtained by dividing a product of the first value multiplied by the device size by the write amplification factor value.

In addition, a calculation method of the second data amount may conduct calculation using the following equation:

SecondDataAmount=MaxWriteAmount−CurrentWriteAmount

"MaxWriteAmount" is a preset maximum data amount available for writing in the RNVM module 406.

"CurrentWriteAmount" is a data amount (a.k.a. a third data amount) of data already written in the RNVM module 406. In other words, the third data amount refers to a data amount of the data from the host system 11 currently stored in the RNVM module 406.

That is also to say, the second data amount is a difference between the preset maximum data amount available for writing in the RNVM module 406 and the third data amount.

It should be noted that, the preset maximum data amount available for writing in the RNVM module 406 (i.e., "MaxWriteAmount") would not be greater than a second value, and a calculation method of the second value is provided below:

$$SecondValue = \frac{MaxEraseCount}{WAF \text{ Value}} \times DeviceSize$$

Here, "SecondValue" is the second value, and the second value is a quotient obtained by dividing a product of the maximum average erase count (i.e., "MaxEraseCount") multiplied by the actual device size of the RNVM module 406 (i.e., "DeviceSize") by the write amplification factor value (i.e., "WAF Value").

It should be noted that, the second value is an actual data amount available for writing in the RNVM module 406, and the preset maximum data available for writing in the RNVM module 406 (i.e., "MaxWriteAmount") would be less than or equal the second value. The preset maximum data available for writing in the RNVM module 406 is usually decided by the provider of the RNVM module 406 after consultation with the buyer.

After calculating and obtaining the first data amount and the second data amount, the MMC 502 determines whether to use the single-page programming mode or the multi-page programming mode to program the memory cells of the RNVM module 406 according to the first data amount and the second data amount.

More specifically, when the first data amount is greater than the second data amount, the MMC 502 programs the memory cells of the RNVM module 406 by using the single-page programming mode. Conversely, when the first data amount is not greater than the second data amount, the MMC 502 programs the memory cells of the RNVM module 406 by using the multi-page programming mode.

Further, in another embodiment, when the first data amount is greater than the second data amount and a difference between the first data amount and the second data amount is greater than a threshold, the MMC 502 programs the memory cells of the RNVM module 406 by using the single-page programming mode. Also, when the first data amount is greater than the second data amount and the difference between the first data amount and the second data amount is not greater than the threshold, the MMC 502 programs the memory cells of the RNVM module 406 by using the multi-page programming mode. It should be noted that, the invention is not intended to define a value for the threshold above. In particular, since the MMC 502 periodically calculates the first data amount and the second data amount in order to determine whether to switch between the single-page programming mode and the multi-page programming mode, such threshold can be used to ensure that the first data amount would not suddenly become less than the second data amount within a period of time (i.e., a time interval between two determinations performed by the MMC 502).

Figure 9:
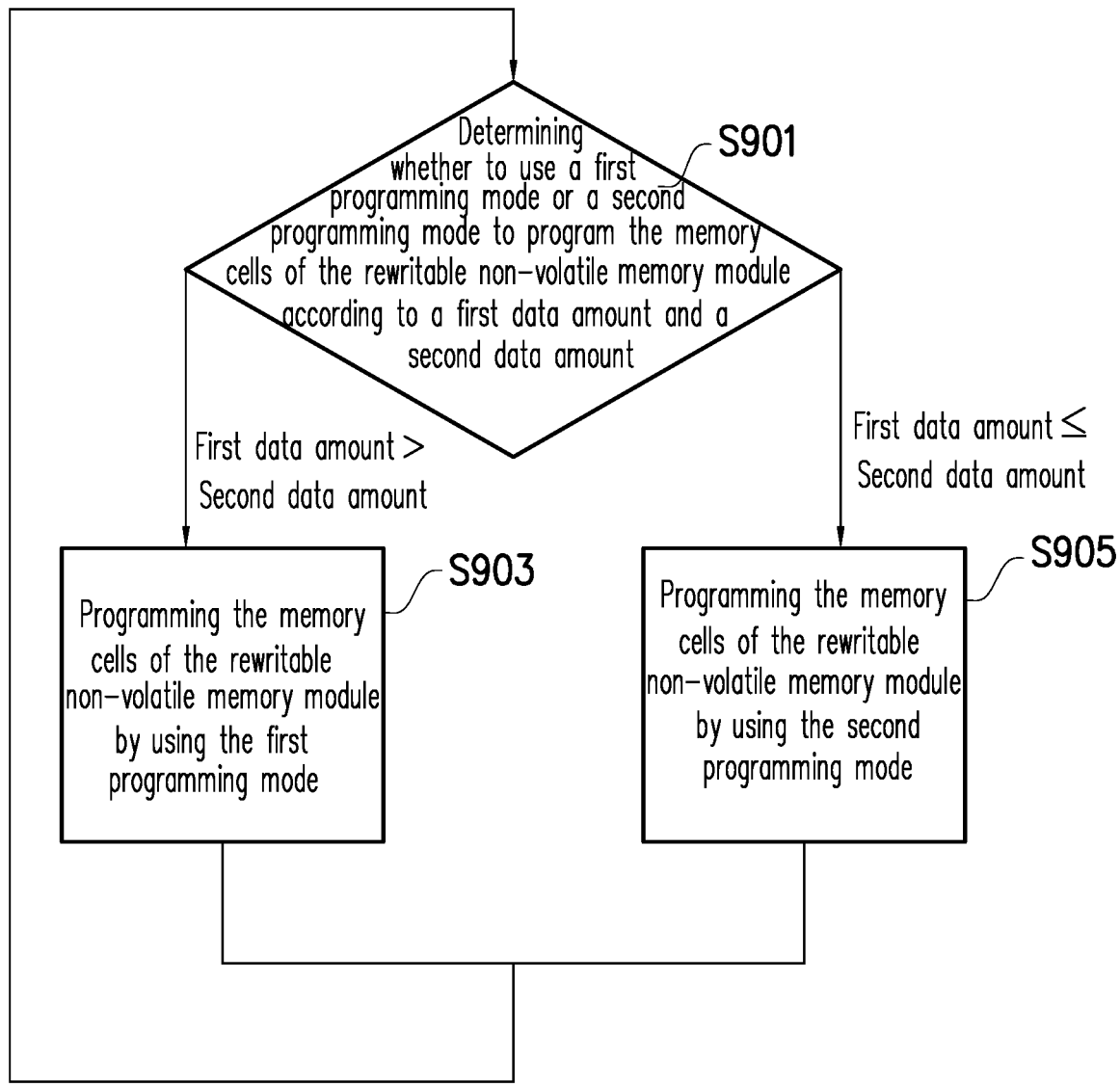
FIG. 9 is a flowchart of a data writing method according to an exemplary embodiment.

FIG. 9 is a flowchart of a data writing method according to an exemplary embodiment.

With reference to FIG. 9, in step S901, the MMC 502 determines whether to use a programming mode or a second programming mode to program the memory cells of the RNVM module 406 according to a first data amount and a second data amount. Here, the first data amount is a data amount currently available to the host system 11 for writing in the RNVM module 406, and the second data amount is a remaining data amount needed to be provided to the host system 11 for writing in the RNVM module 406. When the first data amount is greater than the second data amount, in step S903, the MMC 502 programs the memory cells of the RNVM module 406 by using the first programming mode. When the first data amount is not greater than the second data amount, in step S905, the MMC 502 programs the memory cells of the RNVM module 406 by using the second programming mode. After step S903 or step S905 is completed, the process returns to step S901.

In summary, according to the data writing method, the memory control circuit unit and the memory storage device of the invention, the first data amount and the second data amount may be calculated and obtained so whether to use the first programming mode or the second programming mode to program the memory cells may be dynamically decided according to the calculated first data amount and the calculated second data amount. As a result, after the erase count of the RNVM module is higher than the threshold, the conventional problem in which only the second programming mode can be used while the first programming mode can no longer be used may then be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method, adapted to a memory storage device, the memory storage device having a rewritable non-volatile memory module, the rewritable non-volatile memory module comprising a plurality of physical erasing units, each physical erasing unit among the physical erasing units having a plurality of memory cells, the data writing method comprising:
   determining whether to use a first programming mode or a second programming mode to program the memory cells according to a first data amount and a second data amount,
   wherein the first data amount is an amount of data available to be written before reaching a maximum erase count of the rewriteable non-volatile memory module, and the second data amount is an amount of data written during write operations performed after the step of determining whether to use the first programming mode or the second programming mode until reaching a maximum write amount;
   if the first data amount is greater than the second data amount, programming the memory cells by using the first programming mode; and
   if the first data amount is not greater than the second data amount, programming the memory cells by using the second programming mode,
   wherein the number of stored bits in the memory cells programmed by using the first programming mode is less than the number of stored bits in the memory cells programmed by using the second programming mode.

2. The data writing method according to claim 1, wherein the step of determining whether to use the first programming mode or the second programming mode to program the memory cells comprises:
   if the first data amount is greater than the second data amount and a difference between the first data amount and the second data amount is greater than a threshold, programming the memory cells by using the first programming mode; and
   if the first data amount is greater than the second data amount and the difference between the first data amount and the second data amount is not greater than the threshold, programming the memory cells by using the second programming mode.

3. The data writing method according to claim 1, further comprising:
   calculating the first data amount according to a maximum average erase count of the physical erasing units, a current average erase count of the physical erasing units, a device size of the rewritable non-volatile memory module and a write amplification factor (WAF) value.

4. The data writing method according to claim 3, wherein the first data amount is a quotient obtained by dividing a product of a first value and the device size by the write amplification factor value, wherein the first value is a difference between the maximum average erase count and the current average erase count.

5. The data writing method according to claim 3, wherein the write amplification factor value is obtained by performing a test operation regulated by JEDEC (Joint Electron Device Engineering Council) on the rewritable non-volatile memory module.

6. The data writing method according to claim 3, wherein the second data amount is a difference between a preset maximum data amount available for writing in the rewritable non-volatile memory module and a third data amount of data already written in the rewritable non-volatile memory module.

7. The data writing method according to claim 6, wherein the preset maximum data amount available for writing in the rewritable non-volatile memory module is not greater than a second value, and the second value is a quotient obtained by dividing a product of the maximum average erase count and the device size by the write amplification factor value.

8. A memory control circuit unit, comprising:
a host interface, configured to couple to a host system,
a memory interface, configured to couple to a rewritable non-volatile memory module, wherein the rewritable non-volatile memory module comprises a plurality of physical erasing units, and each physical erasing unit among the physical erasing units has a plurality of memory cells; and
a memory management circuit, coupled to the host interface and the memory interface;
wherein the memory management circuit is configured to determine whether to use a first programming mode or a second programming mode to program the memory cells according to a first data amount and a second data amount,
wherein the first data amount is an amount of data available to be written before reaching a maximum erase count of the rewriteable non-volatile memory module, and the second data amount is an amount of data written during write operations performed after the step of determining whether to use the first programming mode or the second programming mode until reaching a maximum write amount,
wherein if the first data amount is greater than the second data amount, the memory management circuit is further configured to program the memory cells by using the first programming mode,
wherein if the first data amount is not greater than the second data amount, the memory management circuit is further configured to program the memory cells by using the second programming mode,
wherein the number of stored bits in the memory cells programmed by using the first programming mode is less than the number of stored bits in the memory cells programmed by using the second programming mode.

9. The memory control circuit unit according to claim 8, wherein in the operation of determining whether to use the first programming mode or the second programming mode to program the memory cells,
if the first data amount is greater than the second data amount and a difference between the first data amount and the second data amount is greater than a threshold, the memory management circuit is further configured to program the memory cells by using the first programming mode, and
if the first data amount is greater than the second data amount and the difference between the first data amount and the second data amount is not greater than the threshold, the memory management circuit is further configured to program the memory cells by using the second programming mode.

10. The memory control circuit unit according to claim 8, wherein
the memory management circuit is further configured to calculate the first data amount according to a maximum average erase count of the physical erasing units, a current average erase count of the physical erasing units, a device size of the rewritable non-volatile memory module and a write amplification factor (WAF) value.

11. The memory control circuit unit according to claim 10, wherein the first data amount is a quotient obtained by dividing a product of a first value and the device size by the write amplification factor value, wherein the first value is a difference between the maximum average erase count and the current average erase count.

12. The memory control circuit unit according to claim 10, wherein the write amplification factor value is obtained by performing a test operation regulated by JEDEC (Joint Electron Device Engineering Council) on the rewritable non-volatile memory module.

13. The memory control circuit unit according to claim 10, wherein the second data amount is a difference between a preset maximum data amount available for writing in the rewritable non-volatile memory module and a third data amount of data already written in the rewritable non-volatile memory module.

14. The memory control circuit unit according to claim 13, wherein the preset maximum data amount available for writing in the rewritable non-volatile memory module is not greater than a second value, and the second value is a quotient obtained by dividing a product of the maximum average erase count and the device size by the write amplification factor value.

15. A memory storage device, comprising:
a connection interface unit, configured to couple to a host system;
a rewritable non-volatile memory module having a plurality of physical erasing units, each physical erasing unit among the physical erasing units having a plurality of memory cells; and
a memory control circuit unit, coupled to the connection interface unit and the rewritable non-volatile memory module,
wherein the memory control circuit unit is configured to determine whether to use a first programming mode or a second programming mode to program the memory cells according to a first data amount and a second data amount,
wherein the first data amount is an amount of data available to be written before reaching a maximum erase count of the rewriteable non-volatile memory module, and the second data amount is an amount of data written during write operations performed after the step of determining whether to use the first programming mode or the second programming mode until reaching a maximum write amount,
wherein if the first data amount is greater than the second data amount, the memory control circuit unit is further configured to program the memory cells by using the first programming mode,
wherein if the first data amount is not greater than the second data amount, the memory control circuit unit is further configured to program the memory cells by using the second programming mode, wherein the number of stored bits in the memory cells programmed by using the first programming mode is less than the number of stored bits in the memory cells programmed by using the second programming mode.

16. The memory storage device of claim 15, wherein in the operation of determining whether to use the first programming mode or the second programming mode to program the memory cells, if the first data amount is greater than the second data amount and a difference between the first data amount and the second data amount is greater than a threshold, the memory control circuit unit is further configured to program the memory cells by using the first programming mode, and if the first data amount is greater than the second data amount and the difference between the first data amount and the second data amount is not greater than the threshold, the memory control circuit unit is further configured to program the memory cells by using the second programming mode.

17. The memory storage device of claim 15, wherein the memory control circuit unit is further configured to calculate the first data amount according to a maximum average erase count of the physical erasing units, a current average erase count of the physical erasing units, a device size of the rewritable non-volatile memory module and a write amplification factor (WAF) value.

18. The memory storage device of claim 17, wherein the first data amount is a quotient obtained by dividing a product of a first value and the device size by the write amplification factor value, wherein the first value is a difference between the maximum average erase count and the current average erase count.

19. The memory storage device of claim 17, wherein the write amplification factor value is obtained by performing a test operation regulated by JEDEC (Joint Electron Device Engineering Council) on the rewritable non-volatile memory module.

20. The memory storage device of claim 17, wherein the second data amount is a difference between a preset maximum data amount available for writing in the rewritable non-volatile memory module and a third data amount of data already written in the rewritable non-volatile memory module.

21. The memory storage device of claim 20, wherein the preset maximum data amount available for writing in the rewritable non-volatile memory module is not greater than a second value, and the second value is a quotient obtained by dividing a product of the maximum average erase count and the device size by the write amplification factor value.

* * * * *